(12) United States Patent
Keller et al.

(10) Patent No.: US 9,660,349 B2
(45) Date of Patent: May 23, 2017

(54) MULTIFERROIC SURFACE ACOUSTIC WAVE ANTENNA

(71) Applicants: Scott Macklin Keller, Long Beach, CA (US); Paul Killian Nordeen, Los Angeles, CA (US); Kyle Wetzlar, Los Angeles, CA (US); Michael F. Moon, Mather, CA (US); Gregory Paul Carman, Los Angeles, CA (US); Scott Richard Burnside, Rescue, CA (US)

(72) Inventors: Scott Macklin Keller, Long Beach, CA (US); Paul Killian Nordeen, Los Angeles, CA (US); Kyle Wetzlar, Los Angeles, CA (US); Michael F. Moon, Mather, CA (US); Gregory Paul Carman, Los Angeles, CA (US); Scott Richard Burnside, Rescue, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 1 day.

(21) Appl. No.: 14/753,330

(22) Filed: Jun. 29, 2015

(65) Prior Publication Data
US 2016/0380357 A1 Dec. 29, 2016

(51) Int. Cl.
*H01Q 11/02* (2006.01)
*H03H 9/25* (2006.01)

(52) U.S. Cl.
CPC ............... *H01Q 11/02* (2013.01); *H03H 9/25* (2013.01)

(58) Field of Classification Search
CPC .. H01Q 1/28; H01Q 1/32; H01Q 1/52; H01Q 3/44
(Continued)

(56) References Cited

U.S. PATENT DOCUMENTS 8,803,751 B1 * 8/2014 Miller ................. H01Q 1/28
343/787
2010/0015918 A1 1/2010 Liu et al.
(Continued)

FOREIGN PATENT DOCUMENTS

CN 104198963 A 12/2014
JP 2010-145147 A 7/2010
WO 2014/138376 A1 9/2014

OTHER PUBLICATIONS

Scott Macklin Keller, Wave Propagation in Multiferroic Materials, UCLA Thesis, 2013, available from: http://escholarship.org/uc/item/1x18b4f2.

(Continued)

*Primary Examiner* — Lam T Mai
(74) *Attorney, Agent, or Firm* — Nelson Mullins Riley & Scarborough LLP

(57) ABSTRACT

A method of fabricating a multiferroic antenna element may include providing a electroelastic substrate to transform mechanical oscillations into an acoustic wave, providing a resonator assembly on a surface of the electroelastic substrate where the resonator assembly includes a plurality of magnetoelastic resonators that transform an electromagnetic wave into mechanical oscillations corresponding to a frequency of the electromagnetic wave, and providing an interdigitated electrode assembly at a portion of the electroelastic substrate to convert the acoustic wave into an electrical signal preserving information associated with the frequency of the electromagnetic wave.

20 Claims, 12 Drawing Sheets

(58) Field of Classification Search
USPC .................................................. 343/731, 787
See application file for complete search history.

(56) References Cited

U.S. PATENT DOCUMENTS

2011/0062955 A1* 3/2011 Miller .................... G01R 33/18
324/249
2015/0168503 A1 6/2015 Kim et al.

OTHER PUBLICATIONS

Ce-Wen Nan et al., Multiferroic magnetoelectric composites: Historical perspective, status, and future directions, Journal of Applied Physics, 2008, 103/031101.
Zhi Yao et al., Dynamic Analysis of Acoustic Wave Mediated Multiferroic Radiation via FDTD Methods, IEEE Antennas and Propagation Society International Symposium, 2014.
Search Report for corresponding British Patent Application No. GB1611209.6 dated Nov. 14, 2016.

* cited by examiner

MULTIFERROIC SURFACE ACOUSTIC WAVE ANTENNA

TECHNICAL FIELD

Example embodiments generally relate to wireless communication technology and, more particularly, relate to a design and fabrication method for an antenna with a reduced size relative to the frequency response achievable by the antenna.

BACKGROUND

Antennas are used in a wide variety of applications and technologies for communications and radar. The most common type of antenna, the dipole antenna, forms the basis for many other design variations. These dipole-based antennas, and other conventional antenna designs, are generally fabricated to have sizes that are directly related to the frequency ranges in which such antennas are to operate. For example, conventional antennas are typically designed to have sizes that include element lengths that are ½ or ¼ as long as the wavelength of electromagnetic emissions that are to be transmitted or received by the antennas.

Given the direct relationship between antenna length and frequency that so often applies, it can be appreciated that as the frequency to be supported decreases, the antenna length generally must correspondingly increase. This phenomena means that relatively large antenna sizes would be needed to support communications at lower frequencies. For some applications, such as, for example, portable devices or airborne platforms, size and/or weight restrictions may preclude the use of large antennas. The large antennas may create radar cross section impacts or aerodynamic impacts that are unacceptable for certain applications, or may simply require too many other design tradeoffs to be made to allow such antennas to be supported in certain environments.

Accordingly, it may be desirable to develop a technology that allows a break from the restrictions described above. By providing a technology that allows long dipole style antennas to be removed and replaced with smaller, perhaps conformal antennas, significant improvements may be experienced in the area of wireless communication. For example, applications in the High Frequency (HF) range of 3 MHz to 30 MHz, for HF SIGINT on aircraft and communications for vehicles, aircraft, and man packs may be significantly advanced. Similarly, any other applications where size or weight restrictions have precluded supporting of certain frequency ranges in a communications context may also be greatly aided by such a technology.

BRIEF SUMMARY OF SOME EXAMPLES

Some example embodiments may therefore provide a design and fabrication method for a multiferroic surface acoustic wave antenna with a reduced size relative to the frequency response achievable by the antenna. In this regard, some example embodiments may employ magnetoelastic materials with an electroelastic substrate to dramatically reduce antenna size.

In accordance with an example embodiment, a multiferroic antenna element is provided. The multiferroic antenna element may include a resonator or a resonator assembly, an electroelastic substrate and an electrode or an electrode assembly with an interdigitated electrode. The resonator assembly may include a single or plurality of magnetoelastic resonators that individually and constructively transform an electromagnetic wave into mechanical oscillations corresponding to the frequency of the electromagnetic wave. The electroelastic substrate may be operably coupled to the resonators to transform the mechanical oscillations into an acoustic wave. The electrode or electrode assembly may be operably coupled to the electroelastic substrate to convert the acoustic wave into an electrical signal preserving information associated with the frequency of the electromagnetic wave. An interdigitated electrode is one embodiment of an electrode assembly to read the electric signal.

In accordance with another example embodiment, a method of fabricating a multiferroic antenna element is provided. The method may include providing a electroelastic substrate to transform mechanical oscillations into an acoustic wave, providing a resonator assembly on a surface of the electroelastic substrate where the resonator assembly includes a plurality of magnetoelastic resonators that transform an electromagnetic wave into mechanical oscillations corresponding to the frequency of the electromagnetic wave, and providing an interdigitated electrode assembly at a portion of the electroelastic substrate to convert the acoustic wave into an electrical signal preserving information associated with the frequency of the electromagnetic wave.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

DETAILED DESCRIPTION

Figure 1:
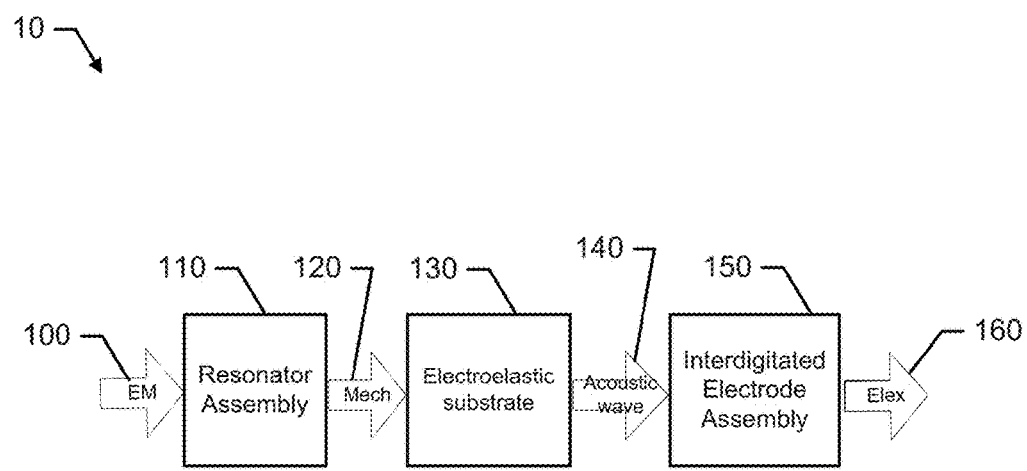
FIG. 1 illustrates a schematic block diagram of a multiferroic antenna element according to an exemplary embodiment.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. Furthermore, as used herein, the term "or" is to be interpreted as a logical operator that results in true whenever one or more of its operands are true.

As discussed above, some example embodiments may employ magnetoelastic or magnetostrictive materials (henceforth referred to as magnetoelastic to mean a magnetically and mechanically coupled material) with an electroelastic, electroelastic or piezoelectric substrate (henceforth referred to as electroelastic to mean electrically and mechanically coupled materials) to dramatically reduce antenna size. In this regard, for example, a bed of magnetoelastic resonators may be deposited onto an electroelastic substrate, in between a pair of interdigitated electrodes (IDEs). When a magnetic field component of a radio wave hits the resonators, the resonators begin to oscillate at the same frequency as the radio wave. Due to the bond between the resonator(s) and the substrate, those oscillations generate predominately acoustic waves in the substrate. Predominately acoustic wave refers to the coupled electromechanical wave traveling in the substrate, i.e. exhibits both displacement and electric field. Reference to an "acoustic wave" in an electroelastic material refers to the coupled predominately acoustic wave. The acoustic waves propagate across the surface of the substrate. The phase velocity of the acoustic waves is approximately five orders of magnitude slower than the incident electromagnetic wave, and so is the corresponding peak to peak wavelength in the electroelastic material. The peaks and valleys of the acoustic wave correspond to compressive and tensile strains in the substrate and therefore correspond to positive and negative voltage potential distributed in the electroelastic substrate, which can then be detected with appropriately sized and spaced IDEs. Information associated with the original radio wave can be decoupled from the voltage signal obtained from an electrode or electrodes on or in proximity to the electroelastic material. Thus, the information associated with the radio wave can also be recovered, without the need for a large antenna element.

Numerous geometric arrangements could exist for the resonator(s) and electrode(s). Numerous electroelastic and magnetoelastic materials could also be used to accomplish the conversion discussed above. When fabricated, an antenna employing the inventive concepts described herein may be orders of magnitude smaller than traditional antennas for the same frequency. Some example embodiments will be described herein.

Figure 2:
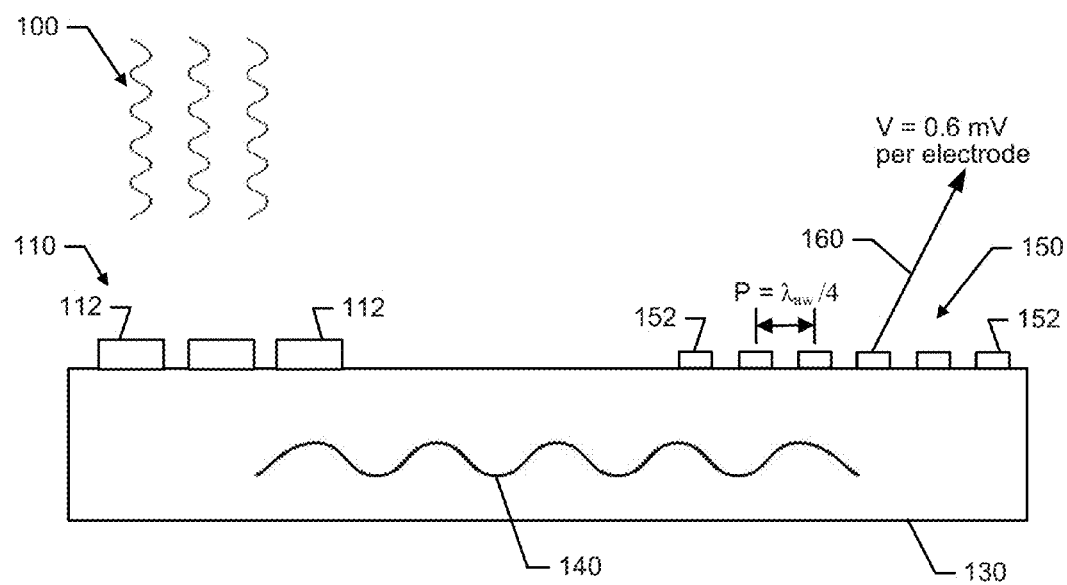
FIG. 2 illustrates a graphical representation of structures associated with the multiferroic antenna element according to an example embodiment.
Figure 3:
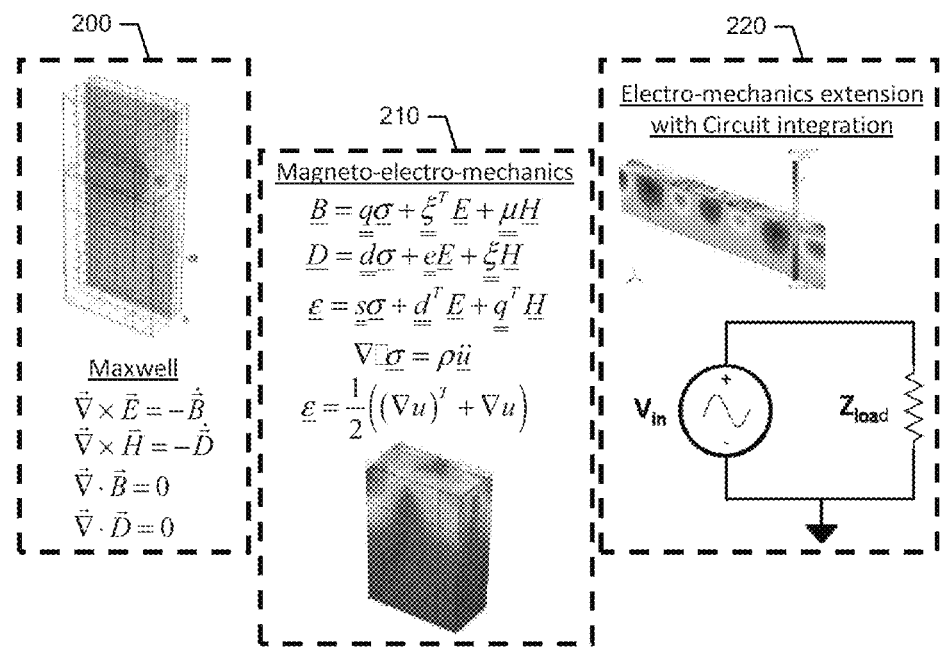
FIG. 3 illustrates a diagram showing the multi-physics analysis for a three stage model corresponding to the processes of FIG. 1 in connection with the structures shown in FIG. 2 in accordance with an example embodiment.

FIG. 1 illustrates a conceptual block diagram of the structures and energy conversions associated with implementation of an example embodiment. FIG. 2 illustrates a graphical illustration of a multiferroic antenna element in accordance with an example embodiment. FIG. 3 illustrates the design and modeling concepts involved in implementing an example embodiment. An example embodiment will be described below in reference to FIGS. 1-3.

A multiferroic is a material or structure that combines multiple ferroic orders. The two main ferroic orders we are considering in the fabrication of our multiferroic composite structure are electroelasticity and magnetoelasticity. In this formulation, oscillating magnetic fields generate a mechanical response in the magentoelastic material which is transferred to electroelastic substrate via strain coupling.

Electroelastic materials generate a voltage potential when mechanically strained and magnetoelastic materials generate mechanical strain in the presence of an external magnetic field. Neither effect is linear, but if operated at a strategically selected bias point, a small change in external magnetic field may result in a relatively large linear change in induced strain, which can be closely approximated by piezomagnetism. Similarly, the amount of strain observed by the electroelastic material can produce a large change in electric polarization which is still in the linear regime and is thus approximated piezoelectrically. Joining these two types of materials together may therefore result in a device that acts as a multiferroic structure, which may be used as described herein in a multiferroic antenna element.

FIG. 1 illustrates a block diagram of multiferroic antenna element 10 according to an example embodiment. In particular, FIG. 1 illustrates a block diagram for performing a three step conversion process associated with designing the multiferroic antenna element 10 in accordance with an example embodiment. As shown in FIG. 1, an incoming signal in the form of electromagnetic wave 100 may be received at a resonator assembly 110. In this regard, the electromagnetic wave 100 may propagate at a given frequency f, and may be incident upon the resonator assembly 110. All waves obey the relationship v=f λ, where v is the velocity of the wave, λ is the wavelength, and f is the frequency. As an example, if the frequency of the electromagnetic wave 100 is 18 MHz, the wavelength ($\lambda_{EM}$) of the electromagnetic wave 100 may be about 16.67 m.

The resonator assembly 110 may convert the electromagnetic wave 100 into mechanical oscillations 120. The resonator assembly 110 may be operably coupled to a electroelastic substrate 130. The electroelastic substrate 130 may convert the mechanical oscillations 120 into an acoustic wave 140. Although not required, Lithium Niobate may be used as the electroelastic substrate 130 in some embodiments but the desired electroelastic coupling can be achieved with a wide variety of electroelastic materials (ie. AlN, PZT, PMN-PT, Quartz, etc). As mentioned above, the acoustic wave 140 may propagate about five orders of magnitude more slowly than the electromagnetic wave 100. The acoustic wave 140 may propagate through the electroelastic substrate 130 to electrode assembly, which may be of an interdigitated design depending on wave propagation parameters, 150 that is also operably coupled to the electroelastic substrate 130. The electrode assembly 150, which may be Gold (Au), but could be embodied by any sufficiently conductive metal or semiconductor, may then convert the electroacoustic wave 140 into an electrical signal 160 preserving the information of the original electromagnetic wave 100.

As shown in FIG. 2, the resonator assembly 110 may be formed from a plurality of magnetoelastic resonators 112. In some embodiments, the magnetoelastic resonators 112 may be comprised of Ni, but could be comprised of other suitable magnetoelastic materials such as Permalloy, Terfenol-D, YiG, CoFeB, FeGaB, NiMgZnO$_3$, Metglas, etc. Magnetoelastic materials are typically soft-magnetic materials that exhibit appreciable magnetostriction. Magnetoelastic materials can be used to convert electromagnetic energy into mechanical energy. Accordingly, when the electromagnetic wave 100 encounters the magnetoelastic resonators 112 of the resonator assembly 110, the magnetoelastic resonators 112 may mechanically oscillate at the frequency of the electromagnetic wave 100, (f). This mechanical oscillation is operably coupled from the magnetoelastic resonators 112 to the electroelastic substrate 130, which converts the mechanical oscillations 120 (see FIG. 1) into the acoustic wave 140.

The acoustic wave 140 propagates through the electroelastic substrate 130 much more slowly than the EM wave travels through air or free space, but still at the frequency (f) of the electromagnetic wave 100 (e.g., 5 orders of magnitude slower). The acoustic wave 140 (such as but not limited to surface acoustic waves (SAW)) may have an electric energy potential associated with the corresponding mechanical wave peaks and valleys. The coupled electromechanical wave can be detected via the electrode assembly 150 to convert the acoustic wave 140 into the electrical signal 160, which preserves the information of the original electromagnetic wave. The electrode assembly 150 of an example embodiment may include IDEs 152, as shown in FIG. 2.

As mentioned above, the conversion processes that are employed in connection with execution of an example embodiment are not linear. However, by strategically selecting a bias point, the three step conversion process described above can be optimized with respect to linear constitutive laws. The optimization method can be applied to either the entire transduction process or to individual conversion steps sequentially.

FIG. 3 illustrates a diagram showing the multi-physics analysis for a three stage model corresponding to the processes of FIG. 1 in connection with the structures shown in FIG. 2 in accordance with an example embodiment. In the first design operation, a numerical analysis process, is used to solve Maxwell's equations and quantify the interactions as well as the local magnetic fields produced in the magnetoelastic resonators 112 (e.g., the Ni elements). The Finite Element Method (FEM) is shown here but a multiplicity of methods, such as FEM, Finite Difference Time Domain or Method of Moments as typical examples, could be used. The first design operation may enable generation of a model for an Electromagnetic Waves Solution (EMW) module 200 which computes the harmonic response of the incoming EM wave using Maxwell's Equations. From the EMW solution obtained in the first design step a harmonic magnetic field solution, which is a function of frequency, is determined. This data may be input into a mechanics/magnetoelastic model at a second design operation to generate a harmonic electroelastic response which, if utilizing COMSOL Multiphysics is solved via the piezoelectric device (PZD) module 210. The second design operation may convert the electromagnetic model input into an electromechanical oscillation. A reduced complexity model, for example a one-quarter symmetry model on an individual magnetoelastic element coupled to a electroelastic substrate may be used to facilitate computation of device performance. Periodic boundary conditions may be used so that an individual element provides a representative response of the entire array. The mechanical model (i.e., the PZD module 210) generated by the second design operation may output boundary conditions on a substrate which transitions an acoustic wave (e.g., acoustic wave 140) into a far field model incorporating an electrode(s) on the electroelastic substrate. In a final model (i.e., an Electrical Circuits (Cir) module 220) associated with a third design operation, the electrode spacing as well as signal strength (i.e., voltage output) may be determined from simulated load circuit connections. The entire three-step modeling process may be operated within the context of a Multidisciplinary Optimization Process (MDO) algorithm to maximize the output power for a given input field strength with parameters of geometry and spacing as the design variables.

Fabrication process for the multiferroic antenna element 10 may include fabricating a variety of magnetoelastic resonator patterns and electrodes on various electroelastic substrates. The geometry and edge termination profiles may vary with different materials employed. Thus, the fabrication process may include fabrication iterations, during which various process improvements may be determined to enhance manufacturing capability and reliability as well as optimize device performance characteristics such as gain and bandwidth for specific frequencies and use cases that are of interest. As such, testing of various structures may be conducted for validation purposes. In some cases, prior to radio frequency testing, samples may be tested in a Magneto-Optic Kerr Effect (MOKE) or other magnetic characterization system to measure the static magnetic behavior of the magnetoelastic resonators.

In some embodiments, design of the multiferroic antenna element 10 may be facilitated using a numerical method such as FEM (e.g., in COMSOL Multiphysics) or other suitable method. The FEM may then be optimized by incorporating an optimization algorithm, such as the particle swarm optimization (PSO) scheme (e.g., in MATLAB) or other suitable method. The analytical modeling/design of the multiferroic antenna element 10 may also include, as mentioned above, running an optimization algorithm operating on the entire three-step process.

Like most numerical formulations, certain assumptions may need to be made to generate a system of solutions that are stable, convergent and solvable in a reasonable amount of time. In order to accomplish this, an initial approximation of the electroelastic and magnetoelastic behavior as linear piezoelectric and piezomagnetic may be assumed for various materials to be used (e.g., for Lithium Niobate (LiNbO3) and Ni, respectively). The magnetoelastic Ni may be treated as polycrystalline and multi-domain with an isotropic saturation magnetostriction coefficient at −32 ppm, a relative permeability of 20 and all other properties defined (e.g. by using COMSOL's built in material coefficients). The LiNbO3 may be treated with a linear rank three tensor to describe the electroelastic coefficients of the trigonal crystal symmetry. Stress-Charge, strain-charge or other constitutive forms commonly used in the art may be used for the analysis. Stress-charge constitutive form coefficient values are provided in Weis R. S., Gaylord T. K., "Lithium Niobate: Summary of Physical Properties and Crystal Structure," Appl. Phys. A 37, 191-203 (1985). The surrounding air, gold (Au) IDE's and SiO2 isolation layer may be treated as fully isotropic media and all of their coefficients may be defined by COMSOL's material library. After the materials are defined, the physics packages involved may be specified appropriately.

The three modules introduced above (i.e., EMW module 200, PZD module 210 and Cir. Module 220) may ultimately function to couple an incoming electromagnetic wave into a multiferroic structure and generate an outgoing electrical signal across output electrodes. The EMW module 210 may define the full set of Maxwell's equations in either frequency or time domain and may be used to establish the incoming electromagnetic wave 100 (or EM wave) as a plane wave. This approximation is valid due to the fact that the magnetoelastic resonators are about 5 orders of magnitude smaller than the wavelength of the electromagnetic wave 100 in air or free space and thus the phase of the electromagnetic wave 100 is nearly constant over an aperture encompassing all resonator elements. For some testing, the electromagnetic wave 100 was generated by a surface current of magnitude 1 A/m established at the upper Z boundary of the surrounding air and enforced by perfect electric conductors (PEC) and perfect magnetic conductors (PMC) placed on the short and long axis of the Ni resonator, respectively. The lower Z boundary is also defined with a PEC to be congruent with it being defined as a ground plane in the PZD module 210 and Cir. Module 220.

The PZD physics package (i.e., the PZD module 210) may be used to define the magnetoelastic and resulting electroelastic effects in two separate geometries. The first geometry encompasses the transduction of the electromagnetic wave 100 to the resonator assembly 110. The Ni element and an insulating SiO2 layer may both be set as linear elastic and electrical materials within the embodiment of the COMSOL FEM simulation. Within the linear elastic sub-module, an initial strain may be defined for the Ni as a function of the magnetic field extracted from the EMW module 200 to provide the magnetoelastic coupling. LiNbO3 is defined as an electroelastic material in a fully anisotropic stress-charge form. The negative Z boundary may be defined as fixed and grounded based on the constraints of the proposed testing apparatus and all boundaries in the XY plane are given symmetry and zero charge conditions to approximate an infinite array of elements. A general extrusion mapping function may be applied to a domain one quarter of the X spacing parameter from the positive X symmetry boundary. This intermediate model output may be used to input displacement and voltage potentials from each node of the first geometrical component to the second. The second geometry contains an extended LiNbO3 element and Au traces which make up the IDE's.

Within the second PZD physics module corresponding to the second geometry, the negative X surface may be coupled to the first study by applying prescribed displacement and voltage conditions on the "incoming surface", which are fed from the general extrusion. Odd IDE's are defined as terminal 1 and even as terminal 2 and are pushed forward into the Cir. Module 220 with a 1000 Ohm resistor placed between them to measure the outgoing voltage. The positive and negative Y surfaces are given symmetry and zero charge conditions to approximate their quasi-infinite nature and the bottom surface is grounded and fixed to match the conditions of the first geometry. Finally, the positive X direction is terminated with a perfectly matched layer (PML) to prevent any reflection of the electromechanical wave off the positive X boundary which would interfere with the incoming wave. As the wafer that is to be used in the physical prototype is several wavelengths larger in length than the array and IDE system, approximating the trailing surface makes sense from both an elastodynamics standpoint as well as a computational one.

Figure 4:
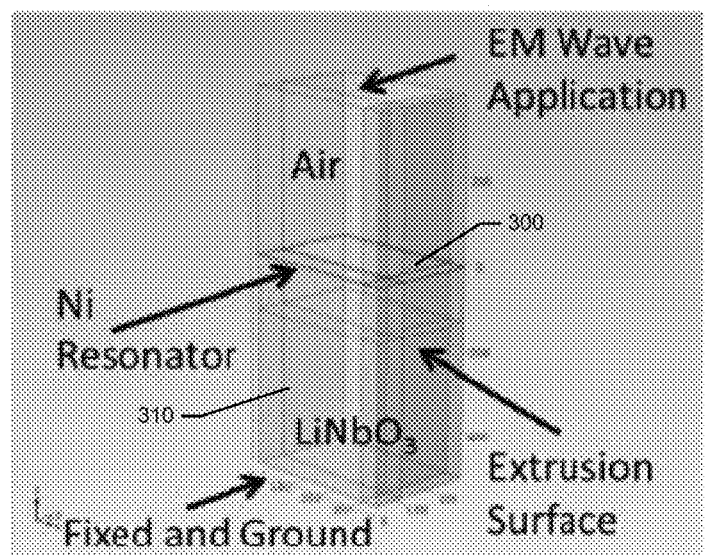
FIG. 4 illustrates a quarter symmetry model for modeling a resonator or array of resonators. The layout shown is a representative model for a quasi-infinite array of Ni resonators on a LiNbO3 substrate in accordance with an example embodiment.
Figure 5:
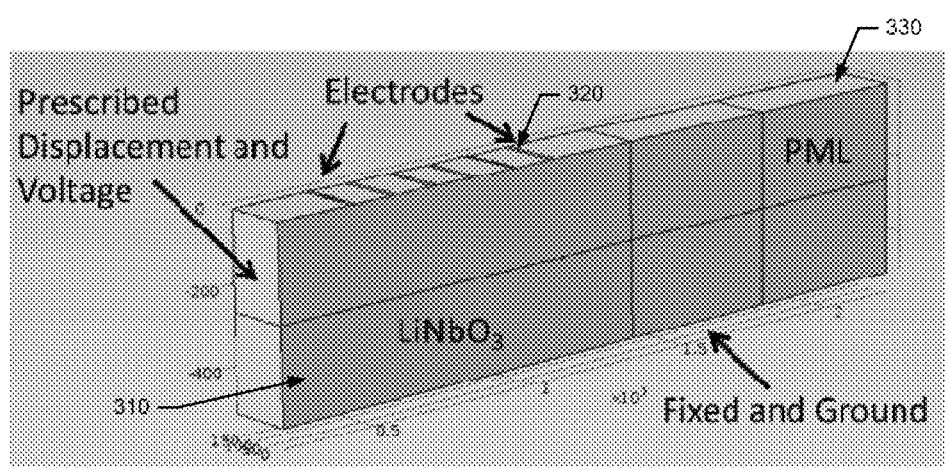
FIG. 5 illustrates a second geometry layout providing an extension of the LiNbO3 substrate, IDE's, a terminating PML, and the circuit model in accordance with an example embodiment.

FIGS. 4 and 5 show the geometric layout of the system. The geometry was broken up into two separate models and three different studies for numerical stability. The first geometry is shown in FIG. 4, which illustrates a quarter symmetry model of a representative Ni element for a quasi-infinite array of Ni resonators 300 on a LiNbO3 substrate 310. The second geometry, shown in FIG. 5, provides the extension of the LiNbO3 substrate 310, IDE's 320 and terminating PML 330. The EMW solution may initially be computed for the first geometry, using a biconjugate gradient numerical method to yield and feed forward the magnetic field in frequency domain. With the magnetic field calculated, its solution may be fed into a second study for the first geometry, which solves the coupled magnetoelastic-electroelastic physics. The resulting displacements and electroelastic voltage are then pushed forward into a third study, which solves the combined electroelastic-circuit model for the second geometry and provides the voltage output from the circuit model.

Figure 6:
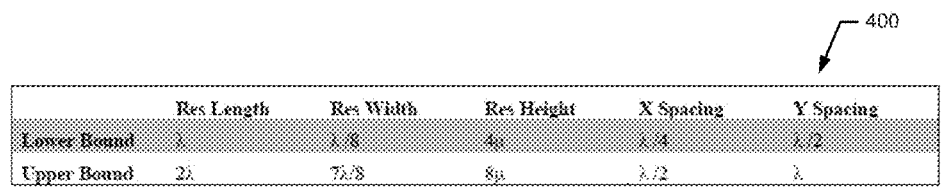
FIG. 6 illustrates a table showing various parameters in PSO space in accordance with an example embodiment. Lambda is the wavelength of the predominately acoustic wave in the antenna material system.

With the FEM model in place, the PSO scheme may be developed (e.g., in MATLAB). PSO is a meta-heuristic algorithm which can search any n-dimensional space that has a defined scalar output. In the present example, the voltage across the IDE's may be used as the optimization function. The algorithm may be based on a formulation by Robinson and Rahmat-Samii (e.g., in Jacob Robinson and Yahya Rahmat-Samii, "Particle Swarm Optimization in Electromagnetics" IEEE Transactions on Antennas and Propagation, 52(2), 2004) using their recommended weighting factors and a modified invisible boundary condition, wherein, instead of simply not computing objective functions outside of the defined parameter space, the personal velocity component is zeroed out so that the social velocity component can pull agents back into bounds faster. Three termination conditions may be set including: global residual error of 0.1%, local residual error of 0.01% and an iteration limit of 100. Many optimization runs may be conducted while locking in on the ideal parameter space as fabrication limitations are considered and for such runs, and a space elucidated table 400, as illustrated in FIG. 6, may be applicable.

Figure 7:
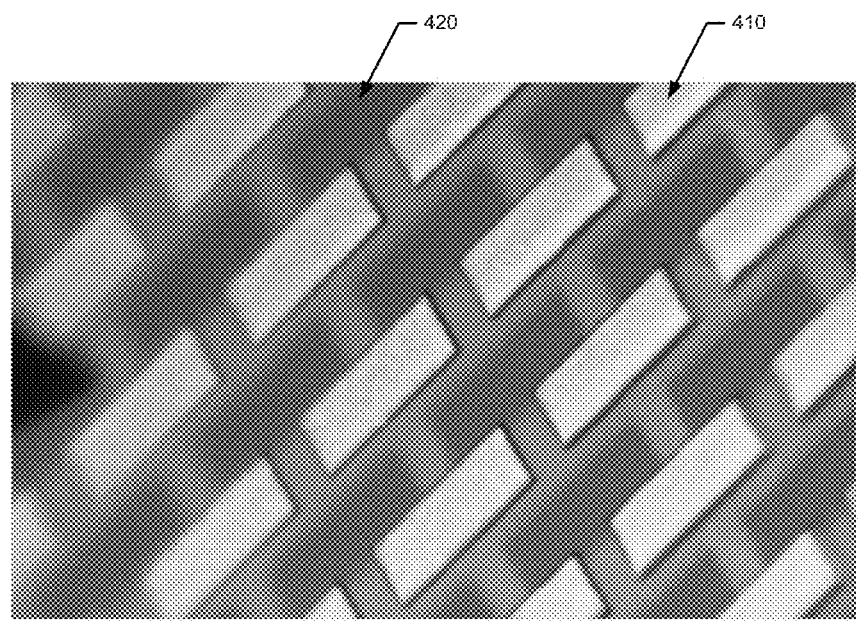
FIG. 7 illustrates an optical image of Ni resonator structures on a LiNbO3 substrate in accordance with an example embodiment.
Figure 8:
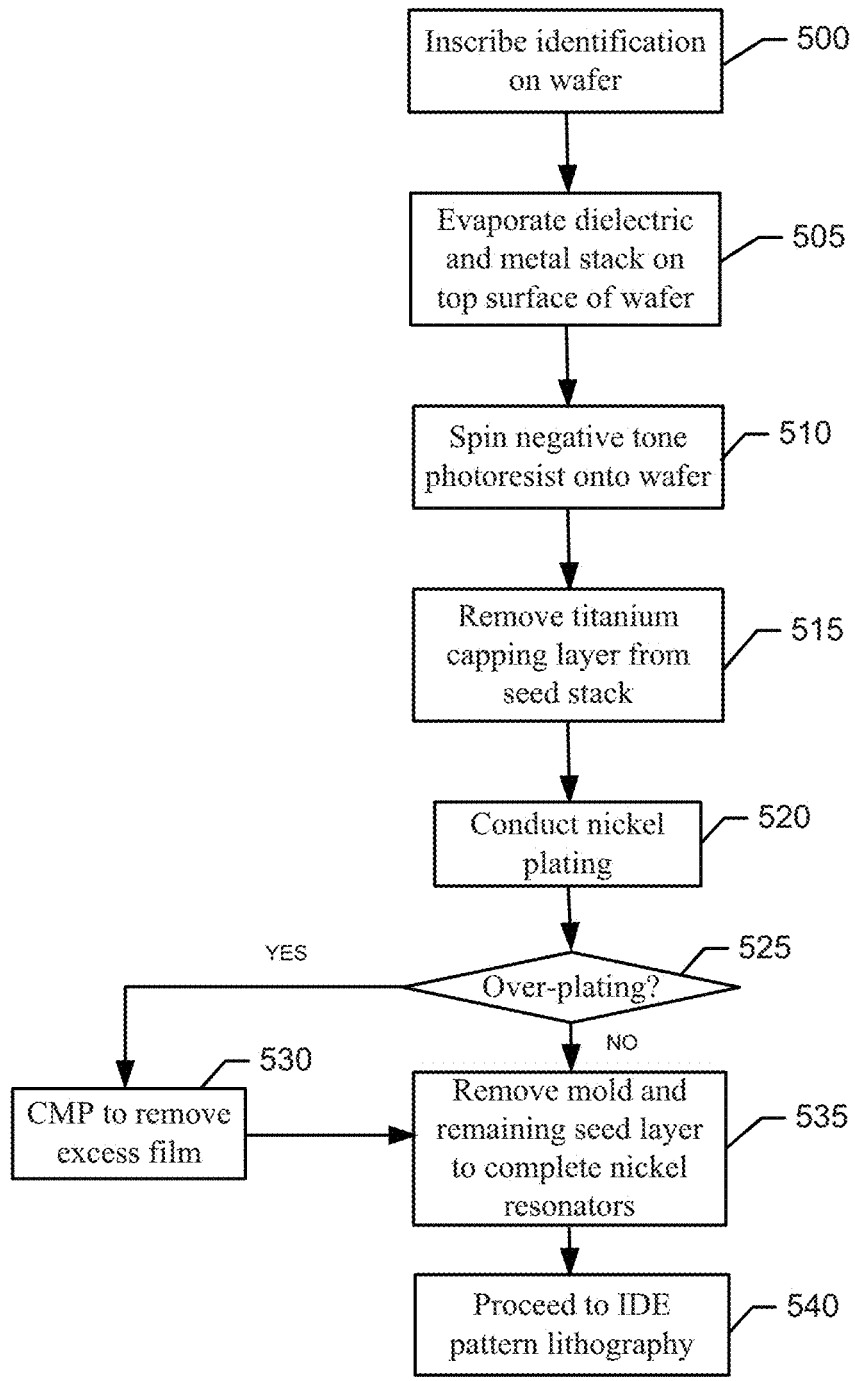
FIG. 8 illustrates a block diagram of a first lithography operation associated with fabrication the multiferroic antenna element according to an example embodiment.

FIG. 7 illustrates an optical image of nickel resonator structures 410 on a Lithium Niobate substrate 420 in accordance with an example embodiment. The array of nickel resonator structures 410 shown in FIG. 7 may be fabricated on four inch diameter 128°XY cut Lithium Niobate wafers. The process of fabrication will be described in reference to FIGS. 8 and 9, which are block diagrams showing process flow associated with fabrication. The wafers may have been optically polished on both sides to a final 500 μm thickness. The XY plane of the Lithium Niobate crystal may be aligned perpendicular to the flat of the wafer. The wafers may be poled perpendicular to the direction of propagation during the growth process.

Fabrication may begin with wafer inscription using a diamond scribe on the back of each wafer for identification during processing in operation 500. A dielectric and metal stack may be evaporated on the top surface of the wafer using an electron beam evaporation system at operation 505. This multi-layered system of materials may act as the seed layer for a nickel electrodepositioning step and to electrically isolate the nickel resonator structures 410 from the Lithium Niobate substrate 420. The stack may include four layers listed in the order they are deposited in the table 600 of FIG.

Figure 10:
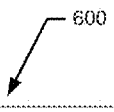
FIG. 10 illustrates a table of deposition parameters of a metal stack in accordance with an example embodiment.

10. Table 600 of FIG. 10 also shows the deposition rate and a brief description of each layer.

Figure 9:
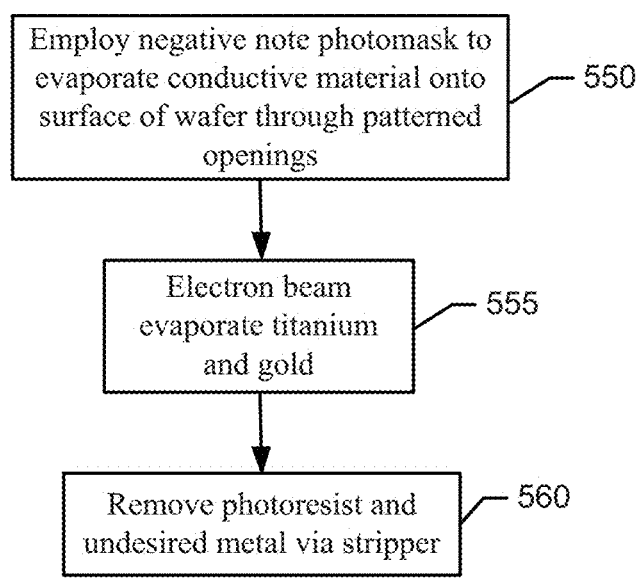
FIG. 9 illustrates a block diagram of a second lithography operation associated with fabrication the multiferroic antenna element according to an example embodiment.
Figure 11:
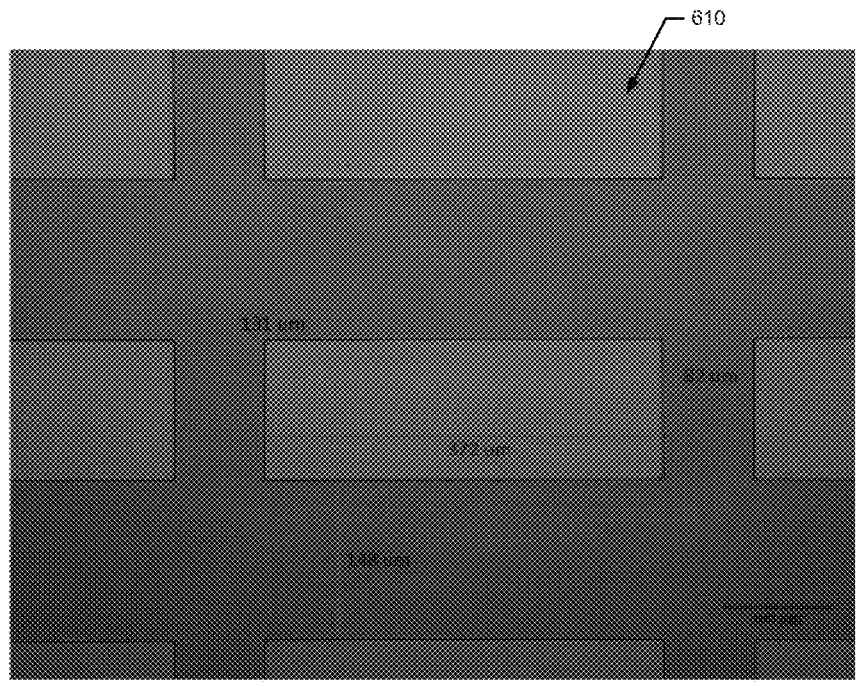
FIG. 11 is an optical image of a patterned photoresist in accordance with an example embodiment.

After evaporation, a negative tone photoresist (e.g., KMPR 1005) may be spun onto the wafers at operation 505. This photolithography step may define a through mask plating mold used in the growth of the nickel elements. FIG. 11 illustrates an optical image of a patterned photoresist in accordance with an example embodiment. The dimensions of the nickel resonator structures 410 (which may be substantially rectangular in shape, as shown in FIG. 9) may include a length of about 372 µm and a width of about 131 µm, with about 82 µm being provided in between longitudinal ends and 148 µm being provided in between transverse edges of adjacent structures to provide a patterned photomask. The rectangular areas 610 are openings to an underlying titanium capping layer. Dimensions of the resonator pattern are marked on the image. The photoresist may be spun to a film thickness of roughly 7 µm to accommodate a resonator design height of 6.4 µm without the occurrence of mushrooming at the top of the nickel element.

Following resist patterning, the wafer may be ready for electroplating. To expose an underlying copper plating seed, the titanium capping layer must be removed from the seed stack at operation 515. Removal of the titanium may be performed in a 1% hydrofluoric acid etching solution. Confirmation of etch completion may be performed visually before nickel plating is conducted at operation 520. The plating solution may be, for example, a commercially available, ready to use nickel plating bath of a Watt's composition. The bath may be maintained at 55° C. with a hotplate and an in-situ thermocouple. A constant current power supply may be held at a current density of about 5 mA/cm$^2$ during deposition. The total deposition time to achieve 6.4 µm may be about 64 minutes for a deposition rate of about 100 nm/min at the selected current density.

A determination may then be made as to whether over-plating has occurred at operation 525. In the event of over-plating and mushrooming from the top of the plating mold, the excess film thickness may be polished down with a chemical-mechanical polishing (CMP) system at operation 530. Generally, processed wafers do not require polishing, however, from previous testing the CMP parameters are: 1 PSI sample to plate pressure, 30 rpm plate speed and 100 nm alumina slurry. This results in a material removal rate of 1 µm/min for the electroplated nickel film.

The plating mold may be removed with a commercial photoresist stripper (e.g., AZ 300T) at 80° C. for 30 minutes. This exposes the underlying seed layer, which covers the remainder of the wafer. This remaining seed layer may be removed at operation 535 with a dilute hydrofluoric acid etch to remove the top titanium capping layer followed by an APS 100 copper etch for the copper seed layer and another hydrofluoric acid etch to remove the final titanium adhesion layer and silicon dioxide isolation layer. The completed nickel resonator structures 410 after the seed stack has been removed from the surface of the Lithium Niobate may look similar to the image in FIG. 7. Thereafter, IDE pattern lithography may be conducted at operation 540 in a second lithography operation, which is described below in reference to FIG. 9.

Figure 12:
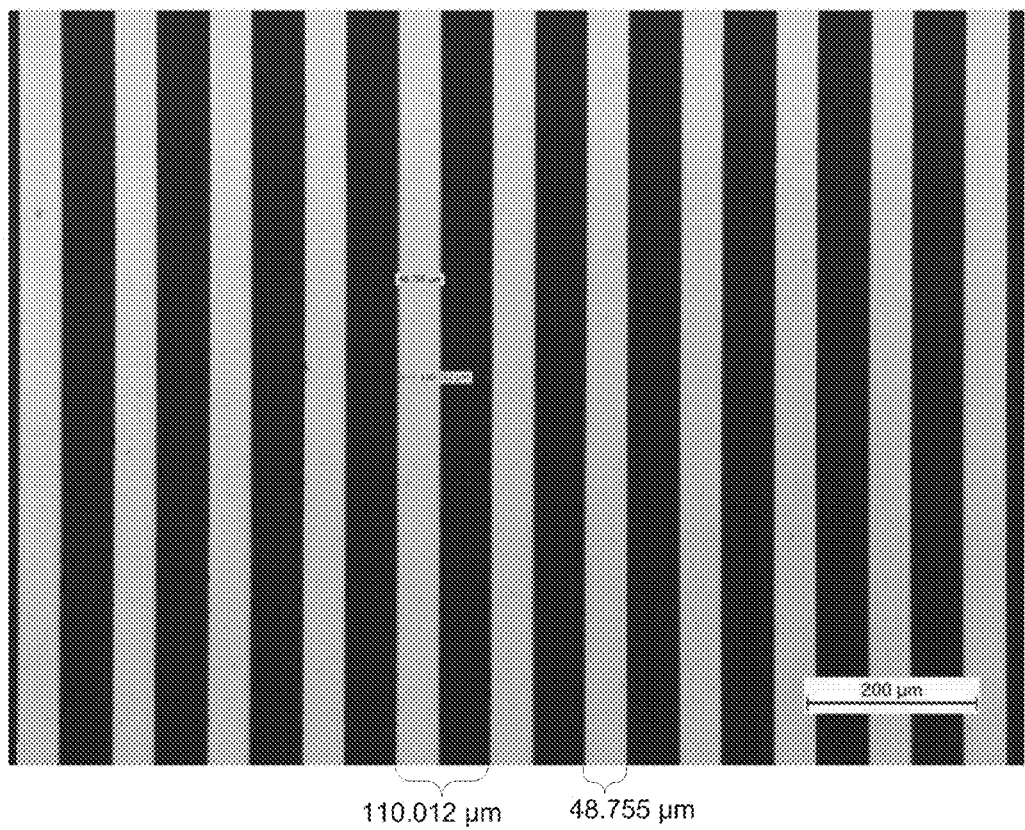
FIG. 12 is an optical image of patterned transducer electrodes after liftoff of evaporated gold over a photomask in accordance with an example embodiment.
Figure 13:
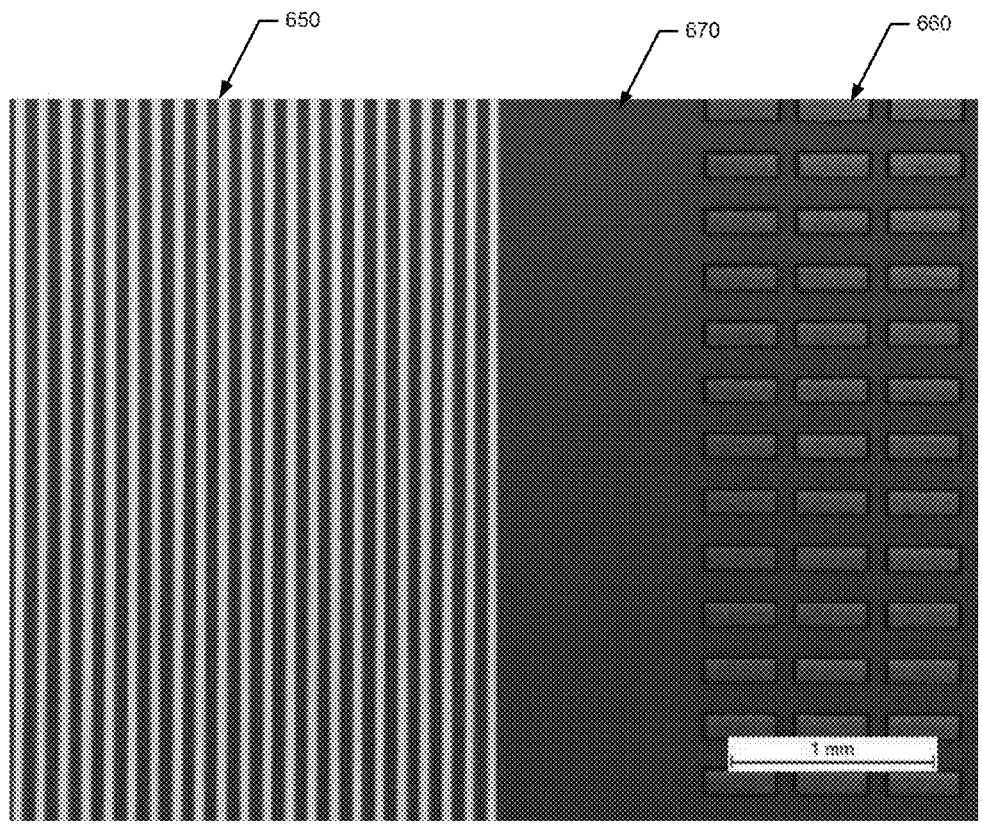
FIG. 13 is an optical image of a completed sample of a multiferroic antenna element in accordance with an example embodiment.

A second lithography step (e.g., using KMPR 1005) may be performed to define the interdigital transducer (IDE) patterns used for device measurement. The negative tone photomask may be used as a liftoff layer through which a conductive material is evaporated onto the surface of the Lithium Niobate at patterned openings in the film at operation 550. Metallization of the IDT structures may be completed by electron beam evaporation of titanium and gold of 20 nm and 100 nm, respectively, at operation 555. An optical image of the completed electrode patterns is shown in FIG. 12, along with dimensions for the IDE pitch and finger width. The photoresist and undesired metal may be removed using commercial photoresist stripper heated to 80° C. for about 12 hours at operation 560. FIG. 13 shows an optical image of a completed test device with both gold IDE 650 and nickel resonator patterns 660 deposited on the surface of a Lithium Niobate wafer 670.

Completed four inch wafers may be cut into 40×70 mm plates containing the two sets of interdigitated transducer (IDT) patterns and nickel resonator patterns. The sample dies are bonded to carriers printed on substrates using single part epoxy. A compliant, soluble adhesive may be chosen for bonding to prevent excessive strain on the bottom surface of the die during curing and to allow for ease of die removal. Two carrier layouts may be used, which connect the IDE patterns to different testing systems.

A direct connection layout is one example of a testing device that may be used with a network analyzer. This connection method may employ edge mounted SMA connectors soldered to CPW transmission lines. These transmission lines may be connected using wire bonding to the IDE pads in a single ended (G-S) arrangement. One of the IDE's may be directly connected to a surface mount SMA connector via a CPW transmission line. The opposing IDE may be connected to an RF differential amplifier. The output of the amplifier may be converted to single ended operation and passed into an RF power detector with the low-pass cutoff frequency set to a default of 100 KHz. The power detector output may be connected to an edge mounted SMA connector. A 5 volt linear voltage regulator may provide power to the amplifier and RF detector.

Various testing methods may be used to characterize the IDE to IDE transmission spectra of the antenna device as well as free space IDE coupling. A vector network analyzer may be used to measure the S21 transmission response by connecting ports one and two to the IDE patterns on each die. This allows for the measurement of a full set of scattering parameters. The frequency may be measured over a 10-50 MHz range using a coupled port power of −5 dBm. A second lock-in method may be used by converting the output response at a receiver IDE into a DC representation of the RF RMS power of the signal and demodulating the power response with a lock-in amplifier. This technique can yield extremely high sensitivity measurements down to 10-12 volt range in the correct test environment. An excitation IDE may be directly connected to a Stanford Research Systems SG382 RF source. The source frequency may be swept from 10-50 MHz at a port power of −5 dBm. This source may also provide a 10 KHz modulation signal for the lock-in reference by using 100 percent amplitude modulation of the RF output. The RF detector output on the receiving may be connected to an EG&G 7220 DSP Lock-In Amplifier. The lock-in preamplifier may provide 20 dB of gain for a full scale sensitivity of 5 mV. The time constant of the internal filter may be fixed to 50 ms. The frequency sweep may be divided into 800 points where a lock-in magnitude measurement is performed at each point.

Testing using methods described herein, and other methods, indicate that the antenna design described herein functions and has sufficient bandwidth to be practical for employment in a number of useful applications. A discussion of each testing method and results therefrom is beyond the scope of this disclosure. However, measurements of response from a multiferroic heterostructure validate the ability of the multiferroic antenna element 10 of FIG. 1 to make the three step conversion and preserve information associated with the original electromagnetic wave. By employing the models described herein, employing optimization techniques and fabrication techniques also described herein, various factors and materials associated with resonator, IDE and substrate design can be modified to achieve the physical size of aperture and bandwidth needed for employing example embodiments in radar, communication and other equipment.

Figure 14:
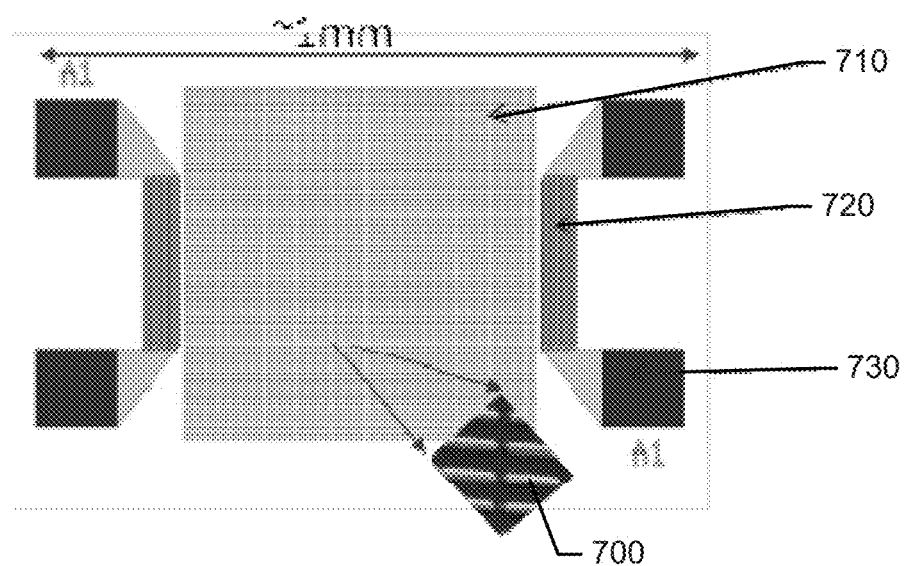
FIG. 14 illustrates a layout of a multiferroic antenna element in accordance with an example embodiment.

In some cases, the finished multiferroic antenna element 10 may be designed to have a relatively small size (e.g., having a length and width of less than about 1 mm). FIG. 14 illustrates one example structure. As shown in FIG. 14, resonators 700 may be distributed over a surface of a wafer (e.g., a Lithium Niobate electroelastic substrate) 710. Balanced IDE's 720 may then be distributed at opposite ends of the wafer 710. In some cases, bonding pads 730 may also be provided to bond the device to another structure.

Figure 15:
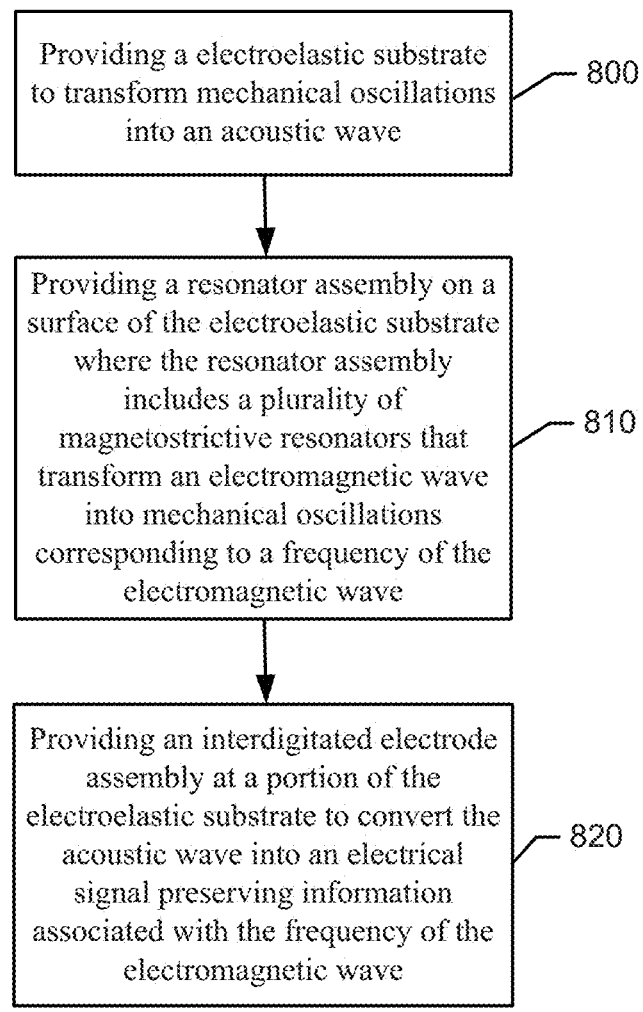
FIG. 15 is a block diagram of major elements and their interconnection in a multiferroic antenna in accordance with an example embodiment.

FIG. 15 illustrates a block diagram of a method of fabricating a multiferroic antenna element in accordance with an example embodiment. The method may include providing a electroelastic substrate to transform mechanical oscillations into an acoustic wave at operation 800. At operation 810, the method may further include providing a resonator assembly on a surface of the electroelastic substrate where the resonator assembly includes a plurality of magnetoelastic resonators that transform an electromagnetic wave into mechanical oscillations corresponding to a frequency of the electromagnetic wave. The method may further include providing an interdigitated electrode assembly at a portion of the electroelastic substrate to convert the acoustic wave into an electrical signal preserving information associated with the frequency of the electromagnetic wave at operation 820.

In some cases, the operations 800-820 may also be modified, augmented or amplified. For example, in some embodiments, the electroelastic substrate may include a Lithium Niobate wafer. In an example embodiment, providing the resonator assembly may include evaporating a dielectric and metal stack on a top surface of the wafer, spinning a negative tone photoresist on the wafer, removing a titanium capping layer from the metal stack, conducting nickel plating, and removing the photoresist and corresponding seed layer to complete nickel-based resonators. In some embodiments, providing the interdigitated electrode assembly may include employing a photomask to evaporate conductive material onto the top surface of the wafer through patterned openings, electron beam evaporating titanium and gold onto the wafer to form interdigitated electrodes, and removing the photoresist and undesired metal via a stripper. In an example embodiment, providing the electroelastic substrate, providing the resonator assembly, and providing the interdigitated electrode assembly may each be conducted based on generating and optimizing a finite element model relative to an optimization variable. In some cases, the finite element model may include physics modules including an Electromagetic Waves Frequency Domain (EMW) module to model the resonator assembly, an Electroelastic Devices (PZD) module to model the electroelastic substrate, and an Electrical Circuits (Cir) module to model the interdigitated electrode assembly. In an example embodiment, the optimization variable may be voltage across interdigitated electrodes of the interdigitated electrode assembly. In some cases, particle swarm optimization may be employed to optimize the finite element model relative to the optimization variable. In an example embodiment, the resonator assembly may be distributed over the top surface of the electroelastic substrate, and electrodes of the interdigitated electrode assembly may be disposed on opposite sides of the electroelastic substrate. In an example embodiment, length and width of the multiferroic antenna element are less than 1 mm.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A multiferroic antenna element comprising:
   a resonator assembly comprising a magnetoelastic resonator that transform an electromagnetic wave into mechanical oscillations corresponding to a frequency of the electromagnetic wave;
   an electroelastic substrate operably coupled to the magnetoelastic resonator to transform the mechanical oscillations into an electrical output; and
   an electrode assembly operably coupled to the electroelastic substrate to allow monitoring of the electrical output.

2. The multiferroic antenna element of claim 1, wherein the magnetoelastic resonator is an array of elements that generate an acoustic wave in the electroelastic substrate.

3. The multiferroic antenna element of claim 1, wherein the electrode assembly comprises an interdigitated electrode assembly.

4. The multiferroic antenna element of claim 1, wherein the electrical output preserves information associated with the frequency of the electromagnetic wave.

5. The multiferroic antenna element of claim 1, wherein the electrical output corresponds to an acoustic wave.

6. The multiferroic antenna element of claim 1, wherein the electroelastic substrate comprises a Lithium Niobate, Quartz, AlNi, PZT, ZnO, LiTaO, or PMN-PT substrate and the magnetoelastic resonators comprise nickel, or a nickel alloy, Terfenol-D, FeGaGaFeB, FeGaGaFe, YIG, CoFe, CoFeB, Metglass, NiZnFeO, MnZnFeO, MnNiZnFe, or FeCoSiB.

7. The multiferroic antenna element of claim 1, wherein physical structures associated with the resonator assembly, the electroelastic substrate and the electrode assembly are fabricated based on corresponding models generated for each structure prior to fabrication.

8. The multiferroic antenna element of claim 7, wherein the corresponding models are generated and optimized relative to an optimization variable or variables.

9. The multiferroic antenna element of claim 8, wherein the optimization variable comprises the voltage across the electrode or the electrode assembly.

10. The multiferroic antenna element of claim 7, wherein each of the corresponding models is a Finite Element Method model, or a Finite Difference Time Domain model, or a Method of Moments model, or a comparable numerical calculation method and may be coupled to a Simulation Program with Integrated Circuit Emphasis (SPICE) model or a comparable circuit simulation method.

11. The multiferroic antenna element of claim 8, wherein one of the corresponding models is a finite element model, and wherein the finite element model comprises physics modules including an Electromagetic Waves (EMW) module to model the resonator assembly, a Piezoelectric Devices (PZD) module to model the electroelastic substrate, and an Electrical Circuits (Cir) module to model the electrode assembly.

12. The multiferroic antenna element of claim 1, wherein the resonator assembly is distributed over a surface of the electroelastic substrate, and wherein electrodes of the electrode assembly are deposited on opposite sides of the electroelastic substrate.

13. The multiferroic antenna element of claim 1, wherein length and width of the multiferroic antenna element are less than a tenth of a wavelength of the electromagnetic wave length.

14. A method of realizing a multiferroic antenna element, the method comprising:
   providing an electroelastic substrate to transform mechanical oscillations into an electrical output;
   providing a resonator assembly on a surface of the electroelastic substrate, the resonator assembly comprising a magnetoelastic resonator that transforms an electromagnetic wave into mechanical oscillations corresponding to a frequency of the electromagnetic wave; and
   providing an electrode assembly at a portion of the electroelastic substrate to monitor the electrical output for translation of the electrical output into an electrical signal.

15. The method of claim 14, wherein providing the resonator assembly comprises:
   depositing a resist layer, which is chemically sensitive to electromagnetic radiation or energetic particles, on a wafer of material corresponding to the electroelastic substrate;
   lithographically patterning the resist layer by selective exposure or by using a photomask to define the areas of exposure;
   removing exposed resist by immersing the wafer in a development solution or removing unexposed resist by immersing the wafer in a development solution;
   definition of the magnetoelastic material by etching an existing layer or by material deposition; and
   removing the resist from the wafer.

16. The method of claim 14, wherein providing the electrode assembly comprises:
   depositing a resist layer, which is chemically sensitive to electromagnetic radiation or energetic particles, on a wafer of material corresponding to the electroelastic substrate;
   lithographically patterning the resist layer by selective exposure or by using a photomask to define the areas of exposure;
   removing exposed resist by immersing the wafer in a development solution or removing unexposed resist by immersing the wafer in a development solution;
   definition of the electrode material by etching an existing layer or by material deposition; and
   removing the resist from the wafer.

17. The method of claim 14, wherein providing the electroelastic substrate, providing the resonator assembly, and providing the electrode assembly are fabricated based on corresponding models generated for each structure prior to fabrication.

18. The method of claim 17, wherein the corresponding models are generated and optimized relative to an optimization variable or variables.

19. The method of claim 17, wherein the optimization variable comprises voltage across electrodes of the electrode assembly.

20. The method of claim 17, wherein each of the corresponding models is a finite element model.

* * * * *